United States Patent [19]

Scardera et al.

[11] Patent Number: 4,761,244
[45] Date of Patent: Aug. 2, 1988

[54] ETCHING SOLUTIONS CONTAINING AMMONIUM FLUORIDE AND AN ALKYL POLYACCHARIDE SURFACTANT

[75] Inventors: Michael Scardera, Hamden; Thomas S. Roche, Cheshire, both of Conn.

[73] Assignee: Olin Corporation, Cheshire, Conn.

[21] Appl. No.: 7,046

[22] Filed: Jan. 27, 1987

[51] Int. Cl.$^4$ .............................................. C09K 13/08
[52] U.S. Cl. .................................. 252/79.3; 156/657; 156/662
[58] Field of Search ....................... 156/662, 655, 657; 252/79.3

[56] References Cited

U.S. PATENT DOCUMENTS

| | | | |
|---|---|---|---|
| 2,942,956 | 6/1960 | Kelly | 252/79.3 |
| 3,181,984 | 5/1965 | Tillis | 252/793 |
| 3,992,235 | 11/1976 | Garbarini | 252/793 |
| 4,040,897 | 8/1977 | Blish, II et al. | 252/79.3 |
| 4,517,106 | 5/1985 | Hopkins et al. | 252/79.4 |
| 4,582,624 | 4/1986 | Enjo et al. | 252/79.4 |
| 4,620,934 | 9/1986 | Hopkins et al. | 252/79.4 |

FOREIGN PATENT DOCUMENTS 58-53980  3/1983  Japan .

OTHER PUBLICATIONS

*Fluorad, Fluorochemical Surfactants,* A product information bulletin by 3M 1982.
Hoffmeister, Schumacher "Method of Reducing . . . by Adding Isopropanol" IBM Tech. Dis. Bull., vol. 27, No. 3 1979.
*McCutcheon's Emulsifiers and Detergents,* North American Edition, Special Food Emulsifier Section, 1982, p. 275.

Primary Examiner—Kenneth M. Schor
Assistant Examiner—Lori-Ann Cody
Attorney, Agent, or Firm—James B. Haglind

[57] ABSTRACT

Etching solutions used to etch, for example, silicon dioxide coated substrates in the manufacture of integrated circuits comprise an aqueous solution of ammonium fluoride and a wetting amount of a nonionic alkyl polysaccharide having the formula:

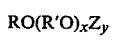

$$RO(R'O)_xZ_y$$

wherein R is alkyl, alkylphenol, hydroxyalkyl, hydroxy alkylphenol, or mixtures thereof and said alkyl groups contain from about 6 to about 18 carbon atoms, R' contains from 1 to about 4 carbon atoms, x is from 0 to about 5, Z is a moiety derived from a reducing saccharide containing from 5 to 6 carbon atoms, and y is from about 1 to about 5. The etching solutions preferably contain hydrogen fluoride in a volume ratio of NH$_4$F to HF of from about 3:1 to about 50:1.

The novel etching solutions of the present invention have excellent wetting characteristics, will not incorporate metallic ions, and retain their wetting properties after extended periods of continuous filtration.

16 Claims, No Drawings

ETCHING SOLUTIONS CONTAINING AMMONIUM FLUORIDE AND AN ALKYL POLYACCHARIDE SURFACTANT

This invention relates to etching solutions used in the manufacture of integrated circuits. More particularly this invention relates to etching solutions containing wetting agents to properly wet substrates of components in the manufacture of integrated circuits.

As integrated circuit component dimensions become small, physical wetting by etchant solutions on substrate surfaces becomes more difficult. This is especially important for buffered oxide etchants i.e., ammonium fluoride/hydrofluoric acid solutions used in silicon dioxide etching. These solutions exhibit extremely high surface tension values of 85 to 90 dynes/cm at typical etching temperatures. Because of the relatively low surface energies of the masking materials used and the photoresist topography, it is difficult to properly wet the substrate, which results in non-uniform etching and poor line reproduction.

While pretreatment ("predipping") of the component into a surfactant solution before placing the substrates in the etching solution is known, more satisfactory results are obtained by the addition of the wetting agent to the etching solution. However, most surfactants commonly used in the industry are insoluble in buffered oxide etchant solutions containing ammonium fluoride and hydrofluoric acid. Further, sufficient amounts of the wetting agent must remain in the etching solution after filtration through filters on the order of 0.2 microns to provide the desired wetting of the substrates during the etching process.

Wetting agents containing fluorochemical compounds have been employed as additives to $NH_4F/HF$ etching solutions to improve wetting properties. Examples of fluorochemical compounds include perfluorinated alkyl sulfonates described in U.S. Pat. No. 4,517,106, issued May 14, 1985, and fluorinated cycloalkane and cycloalkene sulfonates taught in U.S. Pat. No. 4,620,934, issued Nov. 4, 1986 to R. J. Hopkins et al; fluorine-containing carboxylic acids described in U.S. Pat. No. 4,582,624, issued Apr. 15, 1986 to N. Enjo et al; and fluorine-containing diamine compounds as described in Japanese Patent Kokai Publication No. 53,980/1983 published Mar. 30, 1983 by Daikin Kogyo KK. These surfactants may incorporate metallic ions with the etching solution and in addition are expensive.

There is a need for wetting agents which are readily soluble in buffered etching solutions containing ammonium fluoride, which will not incorporate metallic ions in their structure, and which provide excellent wetting properties at reduced costs.

It is an object of the present invention to provide etching solutions for use in integrated circuit manufacture having excellent wetting characteristics and which will not incorporate metallic ions.

Another object of the present invention is to provide buffered etching solutions containing ammonium fluoride and hydrogen fluoride having excellent wetting characteristics which are retained for extended periods of time.

A further object of the present invention is to provide a process for etching silicon dioxide substrates having desirable etching rates.

These and additional objects of the present invention are accomplished in an etching solution comprising an aqueous solution of ammonium fluoride and a wetting amount of a nonionic alkyl polysaccharide having the formula:

$$RO(R'O)_xZ_y$$

wherein R is alkyl, alkylphenol, hydroxyalkyl, hydroxy alkylphenol, or mixtures thereof and the alkyl groups contain from about 6 to about 18 carbon atoms, R'O is an alkoxide which contains from 1 to about 4 carbon atoms, x is from 0 to about 5, Z is a moiety derived from a reducing saccharide containing from 5 to 6 carbon atoms, and y is from about 1½ to about 5.

More in detail, the alkylpolysaccharides which are useful as wetting agents in the etching solutions of this invention having the above formula include those having a hydrophobic group containing from about 6 to about 24 carbon atoms, preferably from about 6 to about 18 carbon atoms, more preferably from about 8 to about 14 carbon atoms. Preferably, the hydrophobic group is in an alkyl group either saturated or unsaturated, branched or unbranched, and more preferably unbranched and saturated. The alkyl group can contain up to three hydroxy groups as substituents. Optionally and less desirably there can be a polyalkoxide, preferably a polyethoxide chain joining the hydrophobic group and the polysaccharide moiety.

The polyalkoxide chain can contain up to about 3, preferably 1, and most preferably no alkoxide moieties.

The polysaccharide portion of the alkylpolysaccharide wetting agent is derived from reducing saccharides containing from 5 to 6 carbon atoms each. Examples of reducing saccharide moieties include, galactose, glucose, fructose, glucosyl, fructosyl, and/or galactosyl moieties. Glucose is preferred. It is essential that the average polysaccharide chain average from about 1 to about 5, preferably from about 1 to about 2½, more preferably from about 1 to about 2 saccharide units. Preferably the amount of alkylmonosaccharide present is from about 30 percent to about 90 percent, more preferably from about 40 percent to about 80 percent, and the amount of alkyl polysaccharides having saccharide chains greater than 2 is preferably less than about 10 percent, more preferably less than about 5 percent, most preferably less than about 2 percent. The saccharide moieties are normally and preferably attached to the hydrophobic group through the one position, but the hydrophobic group can be attached at, e.g., the 2-, 3-, 4-, or 6-positions, thus giving, e.g., a glucose or galactose as opposed to a glucoside or a galactoside. The additional saccharide units can be attached to the previous saccharide unit's 2-, 3-, 4-, and 6-positions.

Alkyl polysaccharides suitable as wetting agents can be produced by processes described in U.S. Pat. Nos. 3,219,656; 3,598,865; 3,721,633; and 3,772,269 among others. These wetting agents are commercially available, for example, from Rohm & Haas (Tradename: Triton BG-10) and Horizon Chemicals (Tradename: APG surfactants).

These liquid nonionic wetting agents are employed in any suitable wetting amounts which, in the buffered oxide etching solutions, will enhance the wetting of the substrate to be etched. Suitable amounts include those in the range of from about 5 to about 50,000 parts per million by weight, preferably from about 25 to about 30,000, and more preferably from about 50 to about 5,000 parts per million.

The novel etching solutions of the present invention all retain their wetting properties after 0.2 micron filtration, even under continuous filtration conditions. Moreover, the etching solutions after filtering have the property of wetting substrates more effectively and yield more uniform results by etching small geometries (1 to 5 microns) and large geometries (>5 micron) of silicon dioxide in a patterned resist at the same rate without additional deleterious effects. Further, the nonionic wetting agents do not incorporate metallic ions in their structure.

The novel etching solutions of the present invention, as buffered oxide etchants, are aqueous solutions of ammonium fluoride having a concentration of between about 15 percent and about 40 percent by weight of $NH_4F$. Admixed with the ammonium fluoride is an aqueous solution of hydrogen fluoride in amounts which provide the buffered oxide etchant with at least about 3 parts by volume of $NH_4F$ to about 1 part by volume of HF and up to about 50 parts by volume of $NH_4F$ to about 1 part by volume of HF. In preparing the buffered oxide etching solutions of the present invention, commercially available concentrated aqueous solutions of $NH_4F$ (normally about 40 percent by weight) and HF (normally about 49 percent by weight) may be employed.

The novel etching solution of the present invention may be prepared in any suitable manner. For example, an aqueous solution of ammonium fluoride and the wetting agent may be prepared and the hydrogen fluoride then added; the aqueous solutions of ammonium fluoride and hydrogen fluoride and the liquid nonionic wetting agent may be simultaneously blended or the aqueous mixture of ammonium fluoride and hydrogen fluoride prepared and the liquid wetting agent then blended in.

Other additives normally used in buffered oxide etchant solutions may be included in the novel etching solutions of the present invention. For example, polar solvent diluents such as acetic acid, ethylene glycols, glycerol, and lower alkyl alcohols having from 1 to about 4 carbon atoms may be included.

The etching solutions are used to etch silicon dioxide coated substrates in the manufacture of integrated circuits employing methods and procedures known in the semiconductor industry.

The novel etching solutions of the present invention provide etchant solutions with reduced surface tensions after microfiltration which improves substrate wetting and yields superior etchant performance resulting in cleaner surfaces and greater uniformity of etched profiles without incorporating foreign metallic ions. The solutions are stable and have desirable shelf lives without phase separations of the wetting agent from the $NH_4F$ and HF components.

The following examples illustrate the present invention with no intention of being limited thereby.

EXAMPLE 1

A buffered oxide etching aqueous solution was prepared containing 7 parts by volume of ammonium fluoride and 1 part by volume of hydrogen fluoride. To 500 grams of the etchant solution was added 500 parts per million of a liquid nonionic octyl/decyl glucoside (Rohm & Haas Triton BG-10) as the wetting agent. The surface tension of the etching solution was measured with a Du Nouy Ring Tensiometer at 25° C. The solution was filtered through a 0.2 micron polytetrafluoroethylene filter (Millipore) and the surface tension measured again. The results are shown in TABLE I below.

COMPARATIVE EXAMPLES A, B and C

The procedure of EXAMPLE 1 was repeated exactly without the addition of a wetting agent and with the substitution of anionic wetting agents ammonium perfluoroalkyl sulfonate (Fluorad FC-933M Co.) and potassium perfluoroalkyl sulfonate (Fluorad FC-983M Co.) for the nonylphenol polyglycidol ether. The results are shown in TABLE I below.

TABLE I

| Example No. | Wetting Agent | Surface Tension (dynes/cm) Before Filtration | After Filtration |
|---|---|---|---|
| 1 | Octyl/decyl glucoside | 29.1 | 29.3 |
| Comparative A | None | 82.3 | 82.3 |
| Comparative B | Fluorad FC-93 | 21.1 | 79.0 |
| Comparative C | Fluorad FC-98 | 21.2 | 43.2 |

TABLE I shows that the loss of wetting activity, as indicated by an increase in surface tension, is only slight after the filtration of the solution of EXAMPLE 1. For Comparative Examples B and C, however, after filtration there is a substantial increase in the surface tension indicating a significant loss of wetting activity.

EXAMPLE 2

A buffered etchant solution (800 mls) having an $NH_4F:HF$ volume ratio of 7:1 and containing 200 parts per millron of the wetting agent of EXAMPLE 1, was continuously passed through the 0.2 micron filter of EXAMPLE 1 at a rate of 800 mls per minute for a period of 6.5 hours. The surface tension of the solution was measured before filtering and after completion of the filtering period. The results are shown in TABLE II below:

TABLE II

| Example No. | Wetting Agent | Surface Tension (dynes/cm) Before Filtration | After Filtration |
|---|---|---|---|
| 2 | Octyl/decyl glucoside | 29.7 | 32.2 |

This example shows that the loss of wetting activity after continuous filtration over an extended period of time is small.

EXAMPLE 3

Four inch silicon wafers were oxidized thermally to about 6000 A, (determined by ellipsometry) coated with positive photoresist to a thickness of about 1.2 microns, and patterned with masks having geometries of about 1.7 to about 5.0 microns. The etch time was then calculated. One wafer was immersed in the buffered oxide etching solution of EXAMPLE 2 The etching, at 25° C., was conducted until the 100 percent etch time, as calculated, was attained. The etched pattern was then rinsed in water. The wafer was then inspected with a light microscope with a magnification in the range of 400× to 1000×. The results are shown in TABLE III below.

COMPARATIVE EXAMPLE D

The procedure of EXAMPLE 2 was repeated exactly with another silicon wafer. The patterned wafer was immersed in a buffered oxide etching solution (volume ratio 7:1 of NH$_4$F:HF) which contained no wetting agent for the same etch time calculated for EXAMPLE 2. The etched wafer was then rinsed in water and inspected using the procedure of EXAMPLE 2. The results are given in TABLE III below.

TABLE III

| | Percent of Completely Etched Geometries | | | | |
|---|---|---|---|---|---|
| Example No. | % of Etch Time | 5.0 Micron | 3.5 Micron | 2.0 Micron | 1.7 Micron |
| 3 | 100% | 100 | 100 | 100 | 100 |
| Comparative D | 100% | 100 | 87 | 77 | 67 |

EXAMPLE 3 illustrates that the etching solution of the present invention etches small geometries completely within the desired etch time without requiring overetching which results in the loss of pattern definition.

EXAMPLE 4

Solutions of buffered oxide etchant containing a volume ratio of NH$_4$F to HF of 7:1 were prepared containing 5 parts per million and 100 parts per million of the wetting agent of EXAMPLE 1. The surface tension of the solutions was measured using the method of EXAMPLE 1. The solutions were poured into a container which was sealed and stored at ambient temperatures for 6 months. Periodically the containers were opened and the surface tension of each solution measured. The final results are given in TABLE IV.

TABLE IV

| Surfactant | Concentration (ppm) | Surface Tension (dynes/cm) | |
|---|---|---|---|
| | | Initial | After 6 Months |
| Octyl/decyl glucoside | 100 | 30.4 | 29.9 |
| Octyl/decyl glucoside | 5 | 54.9 | 56.7 |

This example shows that the etching solution of the present invention is stable and retains its wetting properties over extended periods of time.

What is claimed is:

1. An etching solution comprising an aqueous solution of ammonium fluoride and a wetting amount of a nonionic alkyl polysaccharide having the formula:

$$RO(R'O)_xZ_y$$

wherein R is alkyl, alkylphenol, hydroxyalkyl, hydroxy alkylphenol, or mixtures thereof and said alkyl groups contain from about 6 to about 18 carbon atoms, R'O is an alkoxide moiety which contains from 1 to about 4 carbon atoms, x is from 0 to about 5, Z is a moiety derived from reducing saccharide containing from 5 to 6 carbon atoms, and y is from about 1 to about 5.

2. The etching solution of claim 1 in which the ammonium fluoride is present in concentrations of from about 15 to about 40 percent by weight.

3. The etching solution of claim 1 in which hydrogen fluoride is present and the volume ratio of NH$_4$F to HF is from about 3:1 to about 50:1.

4. The etching solution of claim 1 in which the wetting amount of nonionic alkyl polysaccharide is from about 5 to about 50,000 parts per million by weight.

5. The etching solution of claim 3 in which R is an alkyl group having from about 8 to about 14 carbon atoms.

6. The etching solution of claim 5 in which x is 0 or 1.

7. The etching solution of claim 6 in which y is from about 1 to about 2½.

8. The etching solution of claim 7 in which the wetting amount is from about 25 to about 30,000 parts per million by weight.

9. The etching solution of claim 8 in which x is 0, and y is from 1 to about 2.

10. A process for etching a silicon dioxide coated substrate which comprises immersing the substrate in an aqueous etching solution comprised of ammonium fluoride and a wetting amount of a nonionic alkyl polysaccharide having the formula:

$$RO(R'O)_xZ_y$$

wherein R is alkyl, alkylphenol, hydroxyalkyl, hydroxy alkyphenol, or mixtures thereof and said alkyl groups contain from about 6 to about 18 carbon atoms, R'O is an alkoxide moiety which contains from 1 to about 4 carbon atoms, x is from 0 to about 5, Z is a moiety derived from a reducing sacharide containing from 5 to 6 carbon atoms, and y is from about 1 to about 5.

11. The process of claim 10 in which the ammonium fluoride is present in concentrations of from about 15 to about 40 percent by weight.

12. The process of claim 10 in which hydrogen fluoride is present and the volume ratio of NH$_4$F to HF is from about 3:1 to about 50:1.

13. The process of claim 10 in which the wetting amount of nonionic alkyl polysaccharide is from about 5 to about 50,000 parts per million by weight.

14. The process of claim 12 in which R is an alkyl group having from about 8 to about 14 carbon atoms.

15. The process of claim 14 in which x is 0 and y is from about 1 to about 2.

16. The process of claim 15 in which the wetting amount is from about 25 to about 30,000 parts per million by weight.

* * * * *